United States Patent [19]
Tailliet

[11] Patent Number: 5,978,261
[45] Date of Patent: Nov. 2, 1999

[54] NON-VOLATILE ELECTRONIC MEMORY AND METHOD FOR THE MANAGEMENT THEREOF

[75] Inventor: Francois Tailliet, Epinay sur Seine, France

[73] Assignee: SGS-Thomson Microelectronics S.A., Saint Genis, France

[21] Appl. No.: 08/979,203

[22] Filed: Nov. 26, 1997

[30] Foreign Application Priority Data

Nov. 29, 1996 [FR] France .................................. 96 14715

[51] Int. Cl.$^6$ .................................................. G11C 16/04
[52] U.S. Cl. .............................. 365/185.01; 365/185.29; 365/185.28; 365/185.26
[58] Field of Search ............................... 365/185.05, 189, 365/185, 185.01, 185.26, 185.29, 185.28, 185.06

[56] References Cited

U.S. PATENT DOCUMENTS

| | | | |
|---|---|---|---|
| 4,751,678 | 6/1988 | Raghunathan | 365/189 |
| 5,124,945 | 6/1992 | Schreck | 365/185 |
| 5,283,758 | 2/1994 | Nakayama et al. | 365/185 |
| 5,467,307 | 11/1995 | D'Arrigo et al. | 365/185 |
| 5,583,808 | 12/1996 | Brahmbhatt | 365/185.05 |

FOREIGN PATENT DOCUMENTS

| | | | |
|---|---|---|---|
| 0 606 769 | 7/1994 | European Pat. Off. | G11C 16/06 |
| 0 701 259 | 3/1996 | European Pat. Off. | G11C 16/06 |
| 0 182 198 | 5/1996 | European Pat. Off. | H01L 29/60 |
| 2 215 155 | 9/1989 | United Kingdom | G11C 17/00 |
| WO 92/10837 | 6/1992 | WIPO | G11C 10/04 |

OTHER PUBLICATIONS

French Search Report from French application No. 9614715, filed Nov. 29, 1996.
*A High Capacitive Coupling Ratio (HiCR) Cell for Single 3 V Power Supply Flash Memories*, Kanamori et al., vol. 36, No. 1, Jan. 1995, pp. 122–131.

*Primary Examiner*—David Nelms
*Assistant Examiner*—Thong Le
*Attorney, Agent, or Firm*—Wolf, Greenfield & Sacks, P.C.

[57] ABSTRACT

To increase the integration density of an EEPROM type memory, it is chosen to do without the selection transistor. To then arrive at a selection operation in erasure, programming or reading modes, it is chosen to apply negative voltages or voltages with a value half that of a programming voltage (VPP) to certain connections (with r' different from r) of the memory.

17 Claims, 3 Drawing Sheets

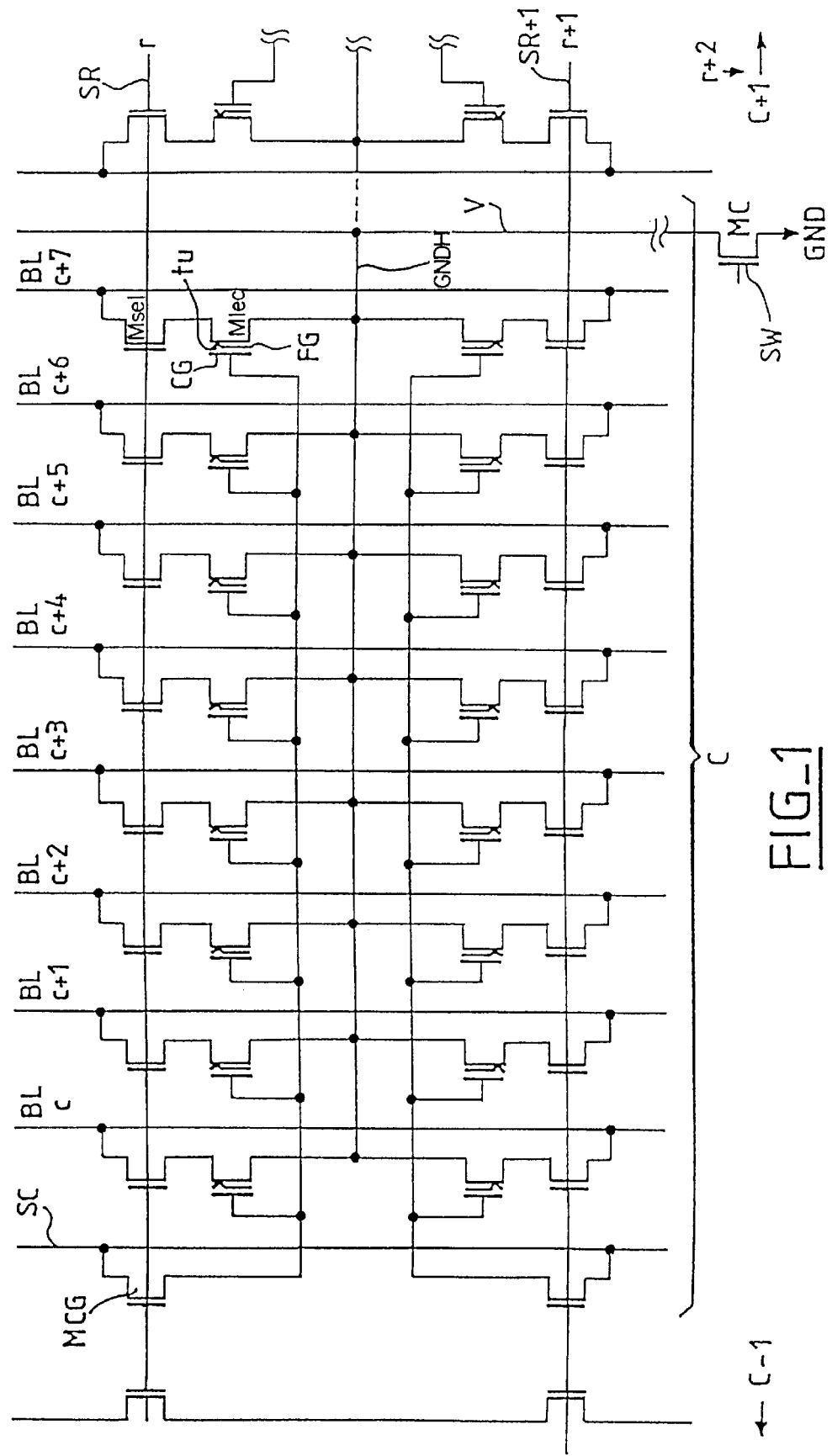
FIG_1 PRIOR ART

| NODES OPERATIONS | SW | SC | BL | SR | SR'≠SR |
|---|---|---|---|---|---|
| ERASURE | Vcc | Vpp | 0 | Vpp | 0 |
| PROGRAMMING | 0 | 0 | Vpp | Vpp | 0 |
| READING | Vcc | CGREF | voltage read | Vcc | 0 |

FIG_2

| NODES OPERATIONS | SW | BL | r | r'≠r |
|---|---|---|---|---|
| ERASURE | Vcc | 0 | Vpp | 0 |
| PROGRAMMING | 0 | Vpp / floating | 0 | Vpp/2 |
| READING | Vcc | voltage read | CGREF | −2 VN |

FIG_4

| NODES OPERATIONS | SW | BL | r | r'≠r |
|---|---|---|---|---|
| ERASURE | Vcc | 0 | Vpp | 0 |
| PROGRAMMING | 0 | Vpp / floating | 0 | Vpp/2 |
| READING | Vcc | voltage read | CGREF | 0 |

FIG_5

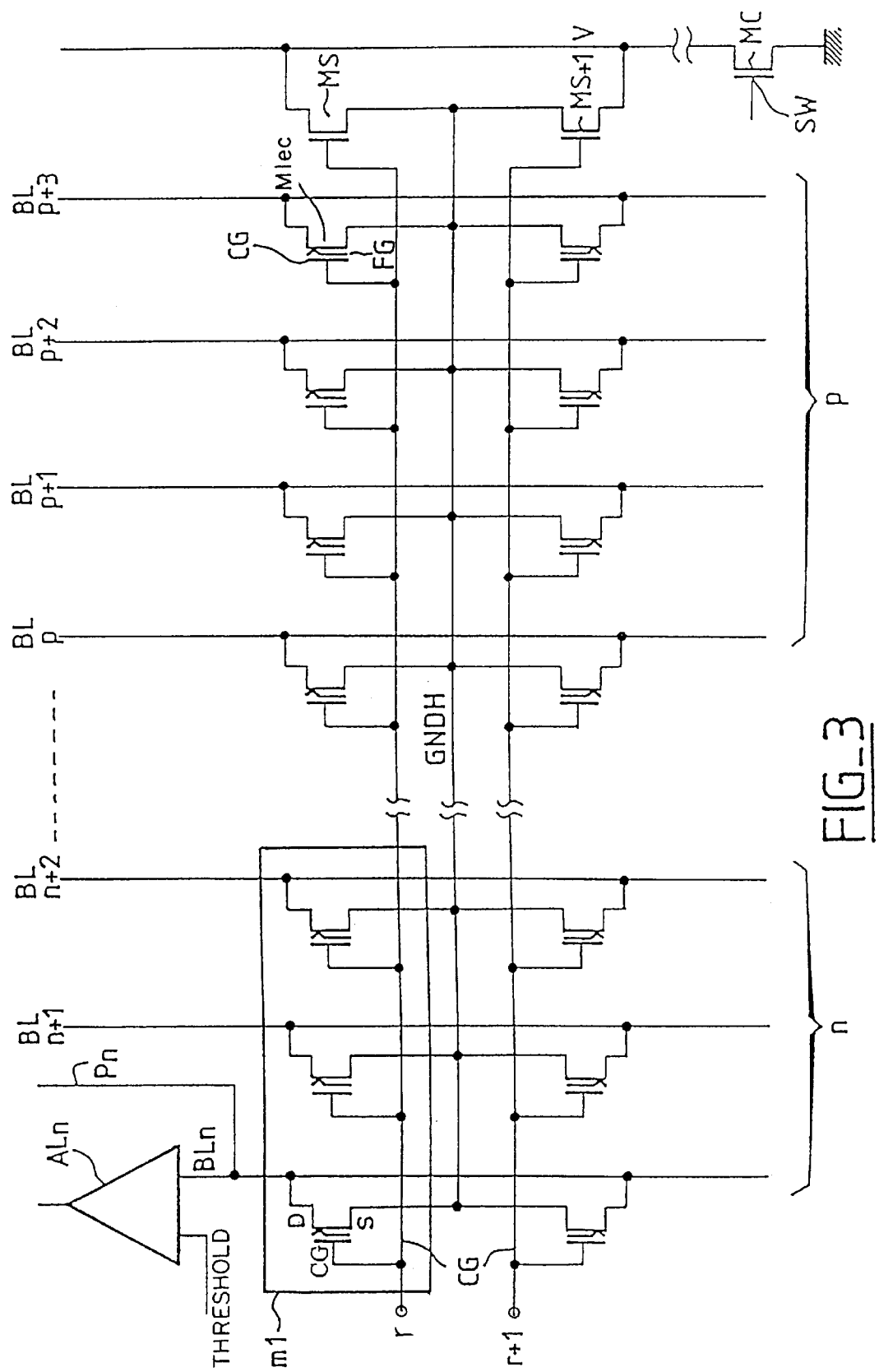
FIG_3

NON-VOLATILE ELECTRONIC MEMORY AND METHOD FOR THE MANAGEMENT THEREOF

BACKGROUND OF THE INVENTION

1. Field of the Invention

The invention relates to non-volatile electronic memories that can be written and erased electrically. It also relates to the method of their management. These memories, known as EEPROMs, are essentially memories whose memory cells each include at least one MOS technology floating-gate transistor. The aim of the invention is to create an EEPROM type memory structure that is more compact than presently available structures, through the elimination of a selection transistor used in the standard EEPROM type memory cell. Consequently, it becomes possible, with the invention, to obtain a gain of about 50% in surface area. This then makes it possible to obtain memory arrays whose density is close to that of FLASH type structures while maintaining the advantages of EEPROM type structures over FLASH type structures.

2. Discussion of the Related Art

It may be recalled that floating-gate EPROMs are memories that are electrically programmable and non-erasable (or erasable by ultraviolet rays which is not the same thing as being electrically erasable). The electrical phenomenon of the programming of these EPROM memories is a phenomenon of thermal agitation in the conduction channel under the effect of a current saturation. This phenomenon is not reversible. The memories known as EEPROMs are electrically erasable and programmable. The phenomenon of programming and erasure, which is reversible, is a tunnel effect phenomenon. As opposed to the current saturation phenomenon, also called hot carrier phenomenon, the tunnel phenomenon has the advantage of not consuming current. The high programming and erasure voltages may then be produced by circuits internal to the memory (load pumps and multipliers). The so-called FLASH memories are hybrid memories. That is, they are programmable by hot carriers and erased by tunnel effect. In practice, the voltages applied to the gates, drains and sources of the floating-gate transistors of the memory cells provide information on the type of programming and erasure that is brought about.

The advantages of the memory cells of the invention over FLASH cells are essentially as follows.

First, the memory cells of the invention have greater endurance, for the erasure and writing operations use only the tunnel effect while the FLASH memories use, in turn, the tunnel effect and the currents of hot electrons.

Second, the memory cells of the invention operation at low supply voltage, for the tunnel current is far smaller than the current of hot carriers, which greatly simplifies the generation of the high voltages needed for the programming mechanisms within the integrated circuit itself. This makes them usable especially in portable applications, powered by cells or batteries, at voltages of the order of 2 or 3 volts.

FIG. 1 enables a description of the structure of an EEPROM type memory array of the related art.

The memory array shown is addressed in matrix form by means of row selection lines SR, SR+1 called word lines and lines SC for the supply of control gates of the floating-gate transistors of the cells of a column. In a column, the cells are assembled in a word of 8, 16, 32, . . . bits as the case may be. FIG. 1 shows one column with an index c and rows of indices r and r+1 in this column. FIG. 1 shows two bytes, eight bit lines BLc to BLc+7 being attached to the column c. It can be seen that the two bytes are shown symmetrically with respect to a switched horizontal ground line called GNDH. The line GNDH is connected to the ground GND of the circuit by connection to a ground line V series-connected with a switching transistor MC whose gate is referenced SW. With each column, therefore, there are associated eight bit lines, one line SC and one ground connection line V. The read circuits are connected to the bit lines of the cells of a word at the time of reading.

An elementary cell, surrounded in FIG. 1, is formed by a selection transistor Msel and a floating-gate transistor Mlec for storage and reading. The transistor Msel enables the conditional connection of a bit line, BLc+7 in this case, to the drain of the transistor Mlec. The transistor Mlec has two stacked gates, one lower floating gate FG and one upper control gate CG. These two gates are separated from each other by a gate oxide that is similar or has a thickness different from the one between the gate FG and the channel of the transistor Msel. The control gates CG of the transistors of one and the same byte are all connected together and connected to the line SC by a control gate selection transistor MCG.

The transistor Mlec has a tunnel window tu with a thickness of about 80 nm, interposed between its floating gate and its drain. In one example, for an EEPROM cell, the thickness of this tunnel window is 80 nm while it is 120 nm for a FLASH EPROM cell. The gate oxide is 200 nm for an EPROM cell. The window tu has the role of letting through a tunnel current (which is very small) between the drain and the floating gate of the transistor Mlec as soon as the voltage between the faces of the tunnel oxide goes beyond a critical threshold of about 10 volts, in fact as soon as the electrical field goes beyond $15.10^6$ V/m. Depending on whether this voltage is positive or negative, the floating gate will be charged negatively or positively. It can therefore be seen that there is a permanent potential difference at the terminals of a capacitor formed by the stack of the gates CG and FG.

The threshold voltage Vt of a MOS transistor is the voltage between the control gate and the source of this transistor, starting from which the transistor becomes conductive. If Vt is the intrinsic threshold voltage of the transistor Msel, the conduction of this transistor Msel is related to the difference V(FG)−Vt where V(FG) is a floating-gate voltage due to the accumulation of the electrical charges at this floating gate. By furthermore applying a read voltage to the gate CG, this difference V(FG)−Vt enables or does not enable the transistor Msel to become conductive. The result thereof is that the conduction of the transistor Mlec depends on the charge of the capacitor CG/FG.

When the transistors MC and Msel are on, the current between a bit line BLi and the ground line V depends on the state of programming of the cell. By applying an appropriate read voltage CGref to the gates CG and by comparing a current flowing between each bit line BL and the line V with a reference value, it is possible to make a remote detection of the state of charging of the floating gate. The result of the comparison is converted into a binary information element.

Typically, it is said that if the current is smaller than the reference current, the cell is erased and corresponds to the storage of a binary 0 value. In a P substrate device using CMOS technology, the erased cells correspond to transistors with electrons stored at the floating gate. If not, the cell is said to be programmed and corresponds to the storage of a binary 1 value (with holes on the floating gate). In read mode, the bit lines of the bytes of the different columns are multiplexed and connected to read amplifiers which are broadly speaking current comparators. This part shall not be described in further detail. It is the same in the invention as in the related art.

The conditions of polarization of the different control nodes of the cells of FIG. 1 are summarized in FIG. 2. In FIG. 2, the nodes SW, SC, BL, SR and SR', which is different from SR are those referred to up till now. The operations are the standard ones of memory management. The spaces in the table show the voltages to be applied to the nodes to obtain the performance of the operation. The write operations may comprise erasure operations only, possibly programming operations only or erasure operations followed by programming operations. The voltage Vcc is equal to about 5 volts and the voltage VPP is equal to about 12 volts.

The programming of a word is done conventionally in two phases:

a phase for the erasure of all the cells of this word—charges are injected (negative charges for a P type substrate) into all the floating gates of the word;

a selective programming phase (the removal of the negative charges and injection of the positive charges for a P type substrate) for the programming of the cells that have to be programmed.

It will be assumed that this process is also applied in the context of the invention and its variants.

The programming operation is the most critical one. The switched ground line V is floating during programming (SW taken to 0) to prevent a direct passage of current between the bit lines BLi taken to VPP and the ground GND, when the floating gate FD gets charged positively. Indeed, in this case, the transistor Mlec could become conductive as soon as its floating gate becomes positive. Owing to the architecture adopted, it can be seen that neither the control gate nor the source of the transistor Msel (having a common node with the drain of the transistor Mlec) of a cell of a byte not selected for the programming or erasure are subjected to high voltage:

if the cell does not form part of the same row (r) as the cell to be programmed, the selection transistors Msel and MCG are off: they are taken to 0 in both cases. If the cell does not form part of the same column as the cell to be programmed, the rows V and BLi are disconnected from the high voltage (by a multiplexer circuit that is not described here).

The result thereof is that the programming of the cell has no effect on the other cells of the memory array which are not to be programmed.

An alternative embodiment can be used to reduce the surface area of the memory array by combining the cells not into n bytes in one and the same row but into a single word of 8×n cells for the entire row. The term used in this case is <>. The advantage of this variant lies in the gain and space due to the elimination of (n−1) lines SC associated with their selection transistors MCG. The gain in terms of space requirement may go up to 20%. The drawback of this is the loss of the individual programming at the level of the byte. The programming thereafter is done only page by page. This type of structure lends itself well to large-sized memories wherein the data elements are renewed by blocks. This variant is schematically similar to that of FIG. 1 except that there is no longer one control gate selection transistor MCG every eight cells but one such transistor for a full page (or for a smaller proportion but for more than eight cells). This variant is conventionally called PEROM (P for page), the standard structure being called EEPROM.

SUMMARY OF THE INVENTION

The invention is aimed at reducing the elementary surface area of a cell to an even greater extent in order to increase the integration density. It will relate to the elimination of cell selection transistors. It can be applied to the standard EEPROM structure or to the PEROM variant. It will be described with respect to the former structure. According to the invention, the problems related to the elimination of the selection transistor are resolved by choosing a particular mode of application of voltages to the nodes of the cell.

An embodiment of the invention is directed to a method for the management, in an integrated circuit, of electrically erasable and electrically programmable memory cells each comprising a floating-gate transistor, said method comprising the following operations:

*for a first cell to be selected, in erasure: a source connection of the floating-gate transistor of this first cell, called the first transistor, is subjected to a ground voltage (0V) of the integrated circuit, a drain connection of this first transistor is subjected to a ground voltage and a control gate of this first transistor is subjected to a high programming voltage which, with respect to the ground voltage, is greater than a supply voltage of an integrated circuit, in programming: the source connection of this first transistor is placed in a state of high impedance, the drain connection of this first transistor is subjected to the high programming voltage or to a high impedance depending on the nature of a bit to be written and the control gate of this first transistor is subjected to a ground voltage, in reading: the source connection of this first transistor is subjected to the ground voltage, the drain of this first transistor is connected to a threshold read amplifier and the control gate of this first transistor is connected to a first intermediate read control voltage between the ground voltage and the supply voltage;

*for a second cell that is not to be selected, in programming: the control gate of the floating-gate transistor, called a second transistor, of this second cell, located in a row other than that of the selected cell, is subjected to another high intermediate programming voltage between the first high programming voltage and the ground voltage, in reading: the source connection of this second transistor is connected to the ground voltage, the drain connection of this second transistor is subjected to the ground voltage and placed in a state of high impedance and the control gate of this second transistor is subjected to a second read control voltage.

Another embodiment of the invention is directed to a method for the management, in an integrated circuit, of electrically erasable and electrically programmable memory cells each comprising a floating-gate transistor, wherein said method comprises the following operations to program a cell:

a) the cell is erased, then b) it is programmed with a partial programming effect by withdrawing electrical charges from the floating gate of the transistor, and then the contents of the cell are read;

c) the steps from b) are started again in increasing the programming effect until the programming level is deemed to be sufficient.

Yet another embodiment of the invention is directed to a memory in an integrated circuit comprising memory cells accessible through bit lines and word lines that are electrically erasable and programmable, each cell comprising a floating-gate transistor made in the form of semiconductor regions buried in a substrate, separated by a conduction channel, the substrate being surmounted by word line connections, a bit line being connected to a read circuit, wherein the drain of this floating-gate transistor is directly connected to the bit line, the control gate of this floating-gate transistor is directly connected to a word line, the source of this floating-gate transistor is connected to a ground of the circuit by means of a switch transistor whose control gate is connected to the word line. Furthermore, the connection Pn enables the voltages that are useful in reading mode to be conveyed on the lines Bn. In practice, the connection Pn is identified with the input of the amplifier ALn. This is also the case with the other bit lines.

BRIEF DESCRIPTION OF THE DRAWINGS

The invention will be understood more clearly from the following description and from the appended figures. These figures are given purely by way of an indication and in no way restrict the scope of the invention. Of these figures:

FIGS. 1 and 2, which have already been commented upon, show the architecture and mode of management of memory cells of a conventional memory;

FIGS. 3 and 4 show the architecture and mode of management of memory cells according to the invention; and FIG. 5 shows an embodiment of a method of management according to the invention.

DETAILED DESCRIPTION

FIG. 3 shows a two-word structure according to the invention. In this structure, groups of cells, for example the groups n and p, are arranged in columns. In each column there are as many bits lines BLn, BLn+1, BLn+2, . . . as there are bits in a word contained in the group. A first word m1 is thus represented in the group of the column n. Each cell of a word is formed by only one floating-gate transistor Mlec. The drains D of these transistors are directly connected to the bit lines BLn. The link is direct in the sense that the bit line BLn being a line that passes over the memory array, the drain D is connected by a passive electrical connection that is highly conductive to this bit line. At one end, the bit line BLn is connected to one input of a threshold read amplifier ALn. This amplifier has two inputs and, at its other input, it receives a threshold, namely a voltage threshold or a current threshold. A phenomenon that occurs on the bit line Bln is compared with this threshold in the amplifier. The transistors of the cells of the words of one and the same column, each having the same rank in its respective word, have their drain connected to one and the same bit line. The control gates CG of the transistors of the cells of a word are connected together to one and the same word line r. These gates are also connected in common with the control gates of the transistors of the words of one and the same row. The sources S of all the floating-gate transistors of a word are connected together. They are connected to the ground, at zero voltage, by a transistor MC as well as by a series-connected transistor MS. This transistor MS is connected by drain and source firstly to the sources S of a word and secondly to a connection V. The word in the row r+1 is connected in the same way by a transistor MS+1. There are as many transistors MS in a row as there are words in this row. The transistor MS is controlled by the signal available on the word line r which is connected to its control gate. The transistors MS, MS+1 of one and the same column all have their sources connected to a line V, which is itself connected to the ground by the transistor MC.

A multiplexer that is not shown is used to connect only a limited number of selected bit lines to read, write and programming circuits. The non-selected bit lines are then either connected to a ground voltage or placed in a state of high impedance. The placing of a line in a state of high impedance, which is also called disconnecting it, amounts to opening the line (in practice interposing a transistor that is off) to prevent a current from flowing through. A zero current or very small current is quite synchronous with high impedance.

It is possible to differentiate between the mode of connection of the control gates of the floating-gate transistors, for example by constituting sets of words. In one example, with 8-bit words, it is possible to make sets of 8 bits and therefore differentiate a row having 512 cells in eight different sets. In this case, there are eight times more word lines r. It is also possible, under the same conditions, to separate the ground connections from the sources of the floating-gate transistors and adopt the PEROM variant seen here above. Depending on the number of programmable read and write circuits connected to the bit line multiplexer, depending on the number of rows r and the separations for the interconnection of the sources, it is possible to access words or groups of words of varying size according to the type of use planned for the memory.

In any case, the method of the invention will be applicable thereto.

The difference with the structure described in FIG. 1 is as follows:

there is no longer any selection transistor Msel, the switched ground GNDH is now connected to the ground by an additional series-connected transistor MS whose gate is connected to the row line, it is the same signal that acts both as a control signal for the gates CG and as a signal on the row line r. There is no longer any connection SC. In other respects, the other connections and interruptions play the same role as in FIG. 1.

FIG. 4 shows the conditions of activation of the different connections for a page (a full row in one example) according to the method of FIG. 3.

The write (erasure and programming) operations conventionally consist of a comprehensive erasure cycle followed by a selective programming cycle.

During an erasure cycle, only the line r of the selected page receives the high voltage VPP (typically 15 V). The lines r' of the pages not accessed in erasure remain at a low voltage Vo as compared with the programming voltage VPP. Typically Vo equals 0. Furthermore, the bit lines, namely all of them or at least the selected ones, are taken to 0 volts while the sources of the selected transistors are taken to 0 volts. In fact, the bit lines are taken to 0 volts by the following mechanism. The line r of the word to be erased is taken to 12 volts. The sources of the cells to be erased are taken to the ground by means of the transistors MS and MC which are conductive. Hence the cells are on. Hence their bit line is taken to the ground voltage by the conduction of the transistor of the cell itself. Thus, electrons migrate from the drain to the floating gate which gets charged with negative charges in the case of a P type substrate.

During a programming cycle, the voltages applied are those of FIG. 4. The line V is taken to high impedance since the transistor MC is turned off by a zero signal at its gate SW. The selected bit lines are taken to VPP or to a floating state (namely a state of high impedance) depending on the value of the bit to be programmed, and the selected word line r is taken to 0 volts. This operation of placing them in a state of high impedance is obtained by making the connection Pn (or the corresponding input of the amplifier ALn) reach an open circuit (for example by means of an off transistor). This takes the sources of the floating-gate transistors to a high impedance by turning the transistor MS off. Nevertheless a problem arises. Owing to the absence of the selection transistor, the drains of the cells of a page that are not selected in programming, with r' different from r, but are located on the same bit line as a cell being programmed, will receive the programming voltage VPP. This could in principle lead to parasitic programming. The solution of the invention consists in ensuring a sufficient level for the voltage Vo to which the control gates CG of the floating-gate transistors of the pages not selected in programming are taken. In this way, the difference in potential between the bit line at VPP of a cell not selected in programming and the control gate of this cell is quite below VPP. Since the conditions of erasure and writing are typically symmetrical, it is deduced that if Vo is in this case in the range of VPP/2, then the voltage at the terminals of the tunnel oxide of a non-selected cell will be equal to ±VPP/2 depending on whether it a 1 or 0 that is to be programmed.

The result thereof, all the same, is that an unselected cell will undergo a disturbance since the voltage at the terminals of its oxide will not be zero. However, because the tunnel current varies exponentially as a function of the difference of potential applied through the tunnel oxide, the current will be several tens of times below the <<deliberate>> programming current of a cell normally selected in programming.

By contrast, it is imagined that after a sufficient number of programmed cycles, non-selected cells could have their state inverted. The invention therefore relates preferably to memories whose contents are comprehensively modified or whose contents may be modified partially but a limited number of times. In short, when the programming is done, for the cells that are not to be selected, if they are located in the same row as the selected cells, their bit lines are connected to a high impedance (especially by the multiplexer of bit lines) and their control gates are taken to zero volts. If they are located in another row, it is necessary to make a distinction depending on whether or not they are in the same column as the selected cells. If they are in the same column, their bit lines are taken to VPP and their control gates to VPP/2. If they are in another column, their bit lines are at high impedance and their control gates are taken to VPP/2. In both cases, at most there is a voltage VPP/2, and this voltage VPP/2 is insufficient for programming.

In read mode, the transistors MC and MS are turned on by signals SW and r taken to a sufficient voltage. For example, the line r can be taken to a voltage CGref equal to VCC (5 volts) which is the supply voltage of the integrated circuit.

Another difficulty arises here too because of the elimination of the selection transistor. Indeed, in the standard approach, a single cell is connected to a selected bit line. In this way, the current between the bit line and the ground corresponds exactly to the current flowing in this single selected cell. In the case of the invention, several cells may be acted upon.

The solution is provided by the placing, at a negative potential, of the control gates of the cells that are connected to the same bit line but belong to a row other than the row of the cell selected in read mode. This negative potential, which is equal in one example to −2 V, turns off a cell that might belong to another word line (or another page) and might be programmed. The negative potential applied to the control gate of the floating-gate transistor of this cell then compensates for the positive potential at which this floating gate is charged. So much so that the floating-gate/substrate voltage of a non-selected program cell is now, at most, smaller than or equal to the threshold voltage of the transistor of the cell. This transistor is no longer on.

For example, if Vt is the threshold voltage of the transistor of the cell, if Vp is the positive charge voltage of the floating gate of the program cell, and if VN is the negative voltage applied to the control gate of the non-selected cell, the transistor will be off if VN+Vp is smaller than Vt, namely VN is smaller than Vt−Vp. Typically, Vt=0.5 V and Vp=2 V. The program cell will therefore be turned off by the application to the control gate of a negative voltage with an absolute value greater than 1 V. For example, −2 V. This voltage is produced by a negative load pump. Pumps of this kind are known and have been described for example in French patent application No. FR-A-2 735 927, which is hereby incorporated by reference.

It is all the more true that an erased cell to which a negative control voltage of this kind is applied is off since the initial charge at its floating gate is already negative. If Vn is the negative charge voltage of the floating gate of an erased cell, the voltage at the floating gate will be equal to: V(FG)=VN+Vn. For a typical value of Vn equal to −2 V, and under the foregoing conditions, V(FG)=−2−2=−4 V.

However, the voltage of a bit line in read mode may conventionally reach 2 volts at the time of the pre-charging of the bit line. In this case, an erased non-selected cell belonging to this bit line will perceive a difference in potential between the drain and the control gate of 2−(−4)=6 V.

A voltage of this kind may then prompt a minute parasitic tunnel current tending to begin the reprogramming of a cell placed under these conditions and at most tending to make it blank. A blank cell is a cell in which there is no charge at all at the floating gate. The phenomenon of parasitic programming can then only tend to make a cell blank for, provided that there are no longer any stored charges, the phenomenon of parasitic programming stops. This parasitic programming current is minute for the tunnel effect varies exponentially with the voltage applied to the tunnel oxide.

Since the voltages necessary to program or erase a cell properly are greater than 12 V, typically a voltage of 5 V will create a minute disturbance. However, it may be imagined that, at the end of several years of continuous reading, a cell that has been initially well erased will become blank (with zero charge). There will therefore be the risk that it will no longer be possible to read this cell. In one improvement, the solution of the invention consists in shifting the read voltage so that a blank cell is in fact read as being erased. A very slight shift is enough, so that a badly programmed cell is nevertheless read as being on.

For example, a cell that is programmed (at +2 V at its floating gate in the first approach of the invention corresponding to a reading at the negative voltages) must let through current at the time of the reading. This current prompts a drop in the voltage of the pre-charged bit line. The voltage of this bit line compared with a reference voltage, for example equal to 1 volt, prompts the switch-over of the (threshold) differential amplifier tLi. Since a cell that is deliberately programmed to an insufficient degree (a cell that has received a charge close to the blank state in the case of the variant) will let through less current, the voltage of the bit line will drop to a smaller extent. Thus, it is enough to increase the value of the comparison voltage. This comparison voltage will, for example, go from 1 volt (for the reading of a true blank cell) to 1.2 volts (for the reading of a cell that has been deliberately programmed to an insufficient degree). In this case, it is again possible to make a reading at the right time.

In the embodiment of the invention, the deactivation of the non-selected cells of a bit line in read mode requires the application of a negative control gate voltage CG. This may have two drawbacks which have already been referred to:

the need to use a negative load pump in read mode, which makes the row decoding circuit more complicated, takes up space and leads to a certain degree of consumption in reading due to the working of this pump; and the disturbance in read mode which tends to make an erased cell blank.

One variant of the invention then consists in sub-programming the cells that have to be programmed. In the case of the first description of the invention, a programmed cell has a positive charge that is sufficiently great at its floating gate so that even if its control gate is taken to 0 V, the read transistor Mlec is on. It is possible, according to the variant, to make the programmed cells only close to the blank state, for example without any charge at the floating gate or even slightly erased (with a smaller negative charge at the floating gate than is the case for the properly erased cell). These programmed cells are then no longer on when their control gate CG is taken to 0 V. In this case, it is no longer indispensable to apply a negative voltage to the control gate of a program cell in order to turn it off.

To read a cell, it is then necessary to make a test to find out if it is properly erased or slightly erased or even close to being a blank cell. The second situation leads to considering it as being programmed. This can be done with conventional read circuits by simply shifting the read level as indicated here above. However there is one difficulty. It is not easy to make a cell go to a state that is close to a blank state. Conventionally, there is no check on the charge of the floating gate during programming or during erasure. Conventionally, the goal is that this charge, at the end of the cycle, should be as high as possible, both positively and negatively. With the variant of the invention, it is planned to control the charge sent to a cell during the programming cycle. It is known that, at the beginning of the programming cycle, the cell is in a perfectly erased state since an erasure has been carried out beforehand. One approach consists then in performing successive programming-and-reading cycles, in increasing the programming level at each time. This level may be increased by increasing VPP from one cycle to another or by increasing, for a given VPP, a number of short programming pulses put into action. At each read operation, the state of the cell is tested. If the cell is read as being programmed, the programming is stopped or possibly an additional programming cycle is performed. The read circuit, in this phase of programming by steps, may also be slightly offset with respect to reading in normal time so as to ensure a certain margin with respect to the reading of a programmed cell. In this offset, a cell that has not been properly made blank, that is to say a cell that is, as yet, far too much in the erased state, is read as being off. As the case may be, before each cycle, the cell is erased again. The cycle then comprises the operations of erasure-programming-reading, with the programming increasing from one cycle to another.

These techniques of gradual programming are of the same type as those used in multi-level charge storage in FLASH or EEPROM type cells.

FIG. 5 shows the new diagram of activation of the cell according to this variant of the invention. Two differences can be seen as compared with FIG. 4. There is no longer any negative voltage. The voltages during the programming are applied in entire cycles of programming and reading. If need be, each of these cycles may include a preliminary erasure stage to achieve he properly control the initial state.

It has also been possible to create an EEPROM or PEROM structure that is far more compact than the standard structure, through the elimination of the selection transistor, by combining the row selection signals and the control gate signal into one and the same signal. The gain in terms of space requirement is about 40%. By furthermore using a PEROM type approach, the gain in surface area as compared with a standard EEPROM memory is in the region of 50%.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for managing, in an integrated circuit, electrically erasable and electrically programmable memory cells, each memory cell including a floating-gate transistor, the method comprising steps of:

to a selected a first cell having a first floating-gate transistor:

during an erasing phase, subjecting a source connection of the first floating-gate transistor to a ground voltage of the integrated circuit, subjecting a drain connection of the first floating-gate transistor to the ground voltage, and subjecting a control gate of the first floating-gate transistor to a first high programming voltage which, with respect to the ground voltage, is greater than a supply voltage of the integrated circuit, during a programming phase, placing the source connection of the first floating-gate transistor in a state of high impedance, subjecting the drain connection of the first floating-gate transistor to one of the first high programming voltage and a high impedance depending on a nature of a bit to be programmed, and subjecting the control gate of the first floating-gate transistor to the ground voltage, and during a reading phase, subjecting the source connection of the first floating-gate transistor to the ground voltage, connecting the drain connection of the first floating-gate transistor to a threshold read amplifier, and connecting the control gate of the first floating-gate transistor to an intermediate first read control voltage between the ground voltage and the supply voltage; and to a non-selected second cell having a second floating-gate transistor:

during the programming phase, subjecting a control gate of the second floating-gate transistor, located in a row other than that of the selected first cell, to an intermediate second high programming voltage between the first high programming voltage and the ground voltage, and during the reading phase, connecting a source connection of the second floating-gate transistor to the ground voltage, subjecting a drain connection of the second floating-gate transistor to the ground voltage and placing the drain connection of the second floating-gate transistor in a state of high impedance, and subjecting the control gate of the second floating-gate transistor to a second read control voltage.

2. The method of claim 1, wherein the step of subjecting the control gate of the second floating-gate transistor to the second read control voltage during the reading phase includes a step of subjecting the control gate of the second floating-gate transistor to a voltage that is negative with respect to the ground voltage.

3. A method for managing, in an integrated circuit, electrically erasable and electrically programmable memory cells, each memory cell including a floating-gate transistor, the method comprising a step of:
   programming a cell by
      erasing the cell;
      applying a partial programming effect by withdrawing electrical charges from a floating-gate of the floating-gate transistor of the cell, and then reading contents of the cell; and
      repeating the step of applying and reading, while increasing the programming effect until a programming level is deemed to be sufficient.

4. The method of claim 3, wherein the step of repeating includes a step of reading the contents of the cell with a read voltage reference that is shifted with respect to a first read voltage.

5. A memory including electrically erasable and electrically programmable memory cells in an integrated circuit, comprising:
   memory cells accessible through bit lines and word lines that are electrically erasable and programmable, each cell including a floating-gate transistor made in the form of semiconductor regions buried in a substrate, separated by a conduction channel, the substrate being surmounted by word line connections, a bit line being connected to a read circuit, wherein a drain of the floating-gate transistor is directly connected to the bit line, a control gate of the floating-gate transistor is directly connected to a word line, a source of the floating-gate transistor is connected to a ground of the integrated circuit by a switch transistor whose control gate is connected to the word line.

6. The memory of claim 5, further comprising a source of negative voltage to be applied to word lines corresponding to non-selected cells.

7. The memory of claim 5, wherein the floating-gate transistor uses a tunnel effect phenomenon.

8. The memory of claim 5, wherein the floating-gate transistor has a tunnel window, with a thickness of about 80 nm, interposed between its floating gate and the drain.

9. The memory of claim 5, wherein the memory cells do not include a selection transistor.

10. A memory circuit including electrically erasable and electrically programmable memory cells, comprising:
   a plurality of memory cells including a first cell having a first transistor, wherein the first transistor is a floating-gate transistor;
   erasing circuitry that erases the first cell by subjecting a source and a drain of the first transistor to a ground voltage, and subjecting a control gate of the first transistor to a first high programming voltage which, with respect to the ground voltage, is greater than a supply voltage of the memory circuit;
   programming circuitry that programs the first cell by placing the source of the first transistor in a state of high impedance, subjecting the drain of the first transistor to one of the first high programming voltage and a high impedance depending on a nature of a bit to be programmed, and subjecting the control gate of the first transistor to the ground voltage; and
   reading circuitry that reads the first cell by subjecting the source of the first transistor to the ground voltage, connecting the drain of the first transistor to a threshold read amplifier, and connecting the control gate of the first floating-gate transistor to an intermediate first read control voltage between the ground voltage and the supply voltage.

11. The memory circuit of claim 10, wherein the plurality of memory cells further includes a second cell having a second transistor; wherein the second transistor is a floating-gate transistor; wherein the programming circuitry, when programming the first cell, subjects a control gate of the second transistor, located in a row other than that of the selected first cell, to an intermediate second high programming voltage between the first high programming voltage and the ground voltage; and wherein the reading circuitry, when reading the first cell, connects a source of the second transistor to the ground voltage, subjects a drain of the second transistor to the ground voltage and places the drain of the second transistor in a state of high impedance, and subjects the control gate of the second transistor to a second read control voltage.

12. The memory circuit of claim 10, wherein the source of the first transistor is connected to the ground voltage by a switch transistor that has a control gate connected to the control gate of the first transistor.

13. The memory circuit of claim 10, wherein the floating-gate transistor uses a tunnel effect phenomenon.

14. The memory circuit of claim 10, wherein the floating-gate transistor has a tunnel window, with a thickness of about 80 nm, interposed between its floating gate and the drain.

15. The memory circuit of claim 10, wherein the erasing, programming and reading circuitry are arranged to access words of varying size.

16. A memory circuit including electrically erasable and electrically programmable memory cells, comprising:
   a plurality of memory cells including a first cell having a first transistor, wherein the first transistor is a floating-gate transistor;
   erasing means for erasing the first cell by subjecting a source and a drain of the first transistor to a ground voltage, and subjecting a control gate of the first transistor to a first high programming voltage which, with respect to the ground voltage, is greater than a supply voltage of the memory circuit;
   programming means for programming the first cell by placing the source of the first transistor in a state of high impedance, subjecting the drain of the first transistor to one of the first high programming voltage and a high impedance depending on a nature of a bit to be programmed, and subjecting the control gate of the first transistor to the ground voltage; and
   reading means for reading the first cell by subjecting the source of the first transistor to the ground voltage, connecting the drain of the first transistor to a threshold read amplifier, and connecting the control gate of the first floating-gate transistor to an intermediate first read control voltage between the ground voltage and the supply voltage.

17. The memory circuit of claim 16, wherein the plurality of memory cells further includes a second cell having a second transistor; wherein the second transistor is a floating-gate transistor; wherein the programming means includes means for subjecting a control gate of the second transistor, located in a row other than that of the selected first cell, to an intermediate second high programming voltage between the first high programming voltage and the ground voltage; and wherein the reading means includes means for connecting a source of the second transistor to the ground voltage, subjecting a drain of the second transistor to the ground voltage and placing the drain of the second transistor in a state of high impedance, and subjecting the control gate of the second transistor to a second read control voltage.

* * * * *